US012276709B2

(12) United States Patent
Choi et al.

(10) Patent No.: US 12,276,709 B2
(45) Date of Patent: Apr. 15, 2025

(54) METAL DETECTION SYSTEM USING SEARCH COIL-TYPE SENSOR

(71) Applicants: Jae Hun Choi, Seoul (KR); Tae Kyun Kim, Guri-si (KR)

(72) Inventors: Jae Hun Choi, Seoul (KR); Tae Kyun Kim, Guri-si (KR); Dong Hyung Kim, Seoul (KR)

(73) Assignees: Jae Hun Choi, Seoul (KR); Tae Kyun Kim, Guri-si (KR)

( * ) Notice: Subject to any disclaimer, the term of this patent is extended or adjusted under 35 U.S.C. 154(b) by 262 days.

(21) Appl. No.: 17/915,047

(22) PCT Filed: Apr. 5, 2021

(86) PCT No.: PCT/KR2021/004223
§ 371 (c)(1),
(2) Date: Sep. 27, 2022

(87) PCT Pub. No.: WO2021/210832
PCT Pub. Date: Oct. 21, 2021

(65) Prior Publication Data
US 2023/0161066 A1    May 25, 2023

(30) Foreign Application Priority Data
Apr. 14, 2020    (KR) .................. 10-2020-0045119

(51) Int. Cl.
*G01V 3/08*    (2006.01)
*G01R 33/00*    (2006.01)
(Continued)

(52) U.S. Cl.
CPC ..... *G01R 33/0005* (2013.01); *G01R 33/0023* (2013.01); *G01R 33/0047* (2013.01);
(Continued)

(58) Field of Classification Search
CPC .......... G01V 3/08; G01V 3/081; G01V 3/104; G01V 3/105; G01V 3/38; G01R 33/0005;
(Continued)

(56) References Cited

U.S. PATENT DOCUMENTS

| 2008/0117044 | A1* | 5/2008 | Hibbs | G01V 3/105 |
| | | | | 340/568.1 |
| 2019/0079211 | A1* | 3/2019 | Keene | G01V 3/081 |
| 2021/0190988 | A1* | 6/2021 | Stephanson | G01V 3/087 |

FOREIGN PATENT DOCUMENTS

| JP | H08291420 A | 11/1996 |
| JP | H10282247 A | 10/1998 |

(Continued)

*Primary Examiner* — Justin Seo
*Assistant Examiner* — Kendrick X Liu
(74) *Attorney, Agent, or Firm* — Bridgeway IP Law Group, PLLC; Jihun Kim

(57) ABSTRACT

A metal detecting system using search-coil type sensor includes sensor modules that detect respective objects which move around the corresponding sensor modules, each sensor module having one or more sensors that include respective housings having respective inner spaces, respective cores formed to be inserted into the inner spaces of the housings, and respective coils which are each wound around a portion of an outer circumferential surface of each of the housings, the portion corresponding to a position of each of the cores; imaging units that image the respective objects that move around the corresponding sensor modules and image respective persons possessing the respective objects; impedance matching units that are connected to a plurality of the sensor modules, respectively, and perform impedance matching; and amplifiers that are connected to the impedance matching units, respectively, and amplify a fine current and voltage generated during approach of the objects to the sensor modules.

8 Claims, 12 Drawing Sheets

(51) Int. Cl.
*G01R 33/02* (2006.01)
*G01R 33/12* (2006.01)
*G01V 3/10* (2006.01)
*G01V 3/38* (2006.01)
*G01V 11/00* (2006.01)

(52) U.S. Cl.
CPC ......... *G01R 33/0094* (2013.01); *G01R 33/02* (2013.01); *G01R 33/12* (2013.01); *G01V 3/081* (2013.01); *G01V 3/10* (2013.01); *G01V 3/105* (2013.01); *G01V 3/38* (2013.01); *G01V 11/00* (2013.01)

(58) Field of Classification Search
CPC ............ G01R 33/0023; G01R 33/0047; G01R 33/0094; G01R 33/02; G01R 33/12
See application file for complete search history.

(56) References Cited

FOREIGN PATENT DOCUMENTS

| | | | |
|---|---|---|---|
| KR | 20-0314113 Y1 | 5/2003 | |
| KR | 20-0355539 Y1 | 7/2004 | |
| KR | 10-0867375 B1 | 11/2008 | |
| KR | 100925259 B1 | * 10/2009 | |
| KR | 102204173 B1 | 1/2021 | |

* cited by examiner

METAL DETECTION SYSTEM USING SEARCH COIL-TYPE SENSOR

TECHNICAL FIELD

The present invention relates to a metal detecting system using a search-coil type sensor, and more specifically, to a technology of detecting a specific object such as firearms and tracking the object.

BACKGROUND ART

Various technologies of SQUID, Fiber-Optic, Flux-Gate, Magnetic Impedance, or the like are applied to magnetic sensors, and the magnetic sensors are highly improved to be applied to respective industrial fields which demand such technologies. In particular, as the Fourth Industrial Revolution era arrives, various IoT products are launched, and thus an application range of the magnetic sensor technology is expanded to an area of everyday life.

Accordingly, Samsung Electro-Mechanics in Korea, Honeywell International Inc. as a multinational conglomerate corporation, and the like have each developed a magnetic sensor in a more compact chip shape and have invested in a variety of research and development for improving a sensing sensitivity or range and reducing a sensing error.

Recently, firearm accidents increase in the U.S.A or the like, and thus there is a growing interest and demand for a system for improving detection performance with respect to a specific object such as an firearm.

Korean Patent Registration No. 10-0867375 (Title of the Invention: Apparatus and Method for Measuring Information of Location and Direction of Moving Object Using Three Magnetic Field Sensors) discloses a method including an installation step of installing two magnetic field sensors corresponding to a surface formed by x and y axes, respectively, to a moving object and installing a magnetic field sensor corresponding to a z axis to the moving object, a storing step of measuring the earth's magnetic field corresponding to x, y, and z axes and storing information values of a reference magnetic field in an internal memory in the moving object, a determining step of causing the moving object to measure magnitudes of a magnetic field on x, y, and z axes while the moving object moves and then determining whether or not an absolute value of a difference between a measured Z-axis magnetic field value and a Z-axis reference magnetic field value is smaller than an error range set in a magnetic field sensor, and an updating step of updating a direction information value of the moving object by using measured x- and y-axes magnetic field values, when determination in the determining step is that the absolute value of the difference between the measured Z-axis magnetic field value and the reference value is smaller than the error range of the sensor.

[Citation List] [Patent Literature] Korean Patent Registration No. 10-0867375

SUMMARY OF INVENTION

Technical Problem

An object of the present invention to solve such a problem described above is to enable a location, displacement, or the like of an object to be detected using a fine magnetic field of the object containing iron without causing any change to a core and a coil which do not have any magnetic component.

In addition, another object of the present invention is to inhibit a detection delay due to a range (non-polarity range) in which a magnetic field subsides temporarily during a change in pole with respect to a sensor due to displacement of an object containing iron.

In addition, still another object of the present invention is to enable measurement or the like of locations of a plurality of objects to be performed and respective movement paths or the like of the plurality of objects to be determined.

Further, still another object of the present invention is to detect a specific object such as firearms and track the object.

Technical objects to be achieved by the present invention are not limited to the technical objects mentioned above, and the following description enables other unmentioned technical objects to be clearly understood by a person of ordinary skill in the art to which the present invention pertains.

Solution to Problem

The present invention to achieve the above-described objects has a configuration including: sensor modules that detect respective objects that move around the corresponding sensor modules, each sensor module having one or more sensors that include respective housings having respective inner spaces, respective cores formed to be inserted into the inner spaces of the housings, and respective coils which are each wound around a portion of an outer circumferential surface of each of the housings, the portion corresponding to a position of each of the cores; imaging units that image the respective objects which move around the corresponding sensor modules or persons possessing the respective objects; impedance matching units that are connected to a plurality of the sensor modules, respectively, and perform impedance matching; and amplifiers that are connected to the impedance matching units, respectively, and amplify a fine current and voltage generated during approach of the objects to the sensor modules. The sensor modules have respective induced magnetic fields formed due to a change in distance from the objects containing iron (Fe). The objects are analyzed using information acquired by the sensor modules and captured images acquired by the imaging units.

In an embodiment of the present invention, the metal detecting system using a search-coil type sensor may further include a first control unit that is connected to the amplifiers and analyzes a waveform of the amplified current and voltage; and a second control unit that is connected to the first control unit to generate object analysis information by analyzing movement and magnetic flux density of the objects and is connected to the imaging units to collect the captured images.

In the embodiment of the present invention, the second control unit may categorize the objects using the object analysis information and the captured images.

In the embodiment of the present invention, the second control unit may determine whether the magnetic flux density of the objects is within a predetermined magnetic flux density range and then determine types of objects by analyzing the captured images.

In the embodiment of the present invention, the second control unit may generate an alarm signal when determining that the objects are firearms.

In the embodiment of the present invention, the metal detecting system using a search-coil type sensor may further include an output unit that is connected to the second control unit, visually outputs locational changes of the objects, and outputs the alarm signal.

In the embodiment of the present invention, the plurality of sensor modules may be formed, and the impedance matching units and the amplifiers may be connected to the each of the plurality of sensor modules, respectively.

In the embodiment of the present invention, a plurality of the sensors may be arranged in parallel or radially with each other.

In the embodiment of the present invention, the plurality of coils provided in the sensors may be arranged in series with each other.

Advantageous Effects of Invention

According to the above-described configuration, the present invention is effective in that a fine change in magnetic field and flux quantity of an object containing iron can be detected such that a location, displacement, or the like of the object containing iron can be detected with ultra-low electric power.

In addition, the present invention is effective in that, even when a range (non-polarity range) in which a magnetic field subsides temporarily is formed during a change in pole with respect to a sensor due to displacement of an object containing iron, a magnetic field of the object containing iron can be detected by another adjacent sensor or coil such that the system can be normally and continuously operated.

In addition, the present invention is effective in that detection and measurement can be performed regardless of arrangement or the like of sensors or sensor modules.

In addition, the present invention is effective in that measurement or the like of locations of a plurality of objects can be performed using a plurality of sensor modules, and thereby respective movement paths or the like of the plurality of objects can be determined.

In addition, the present invention is effective in that, since measurement of the object can be performed using a combination of object analysis information acquired by the sensor module and a captured image acquired by an imaging unit, a measurement speed and measurement accuracy of the objects can be improved.

Further, the present invention is effective in that, since a fine change in magnetic field and flux quantity of an object containing iron can be detected, the system can exhibit the same performance regardless of an effect of air, soil, water, or the like.

The effects of the present invention are construed not to be limited to the above-described effects but to include every effect that can be derived from the configurations of the present invention described in detailed description or claims of the present invention.

DESCRIPTION OF EMBODIMENTS

Figure 1:
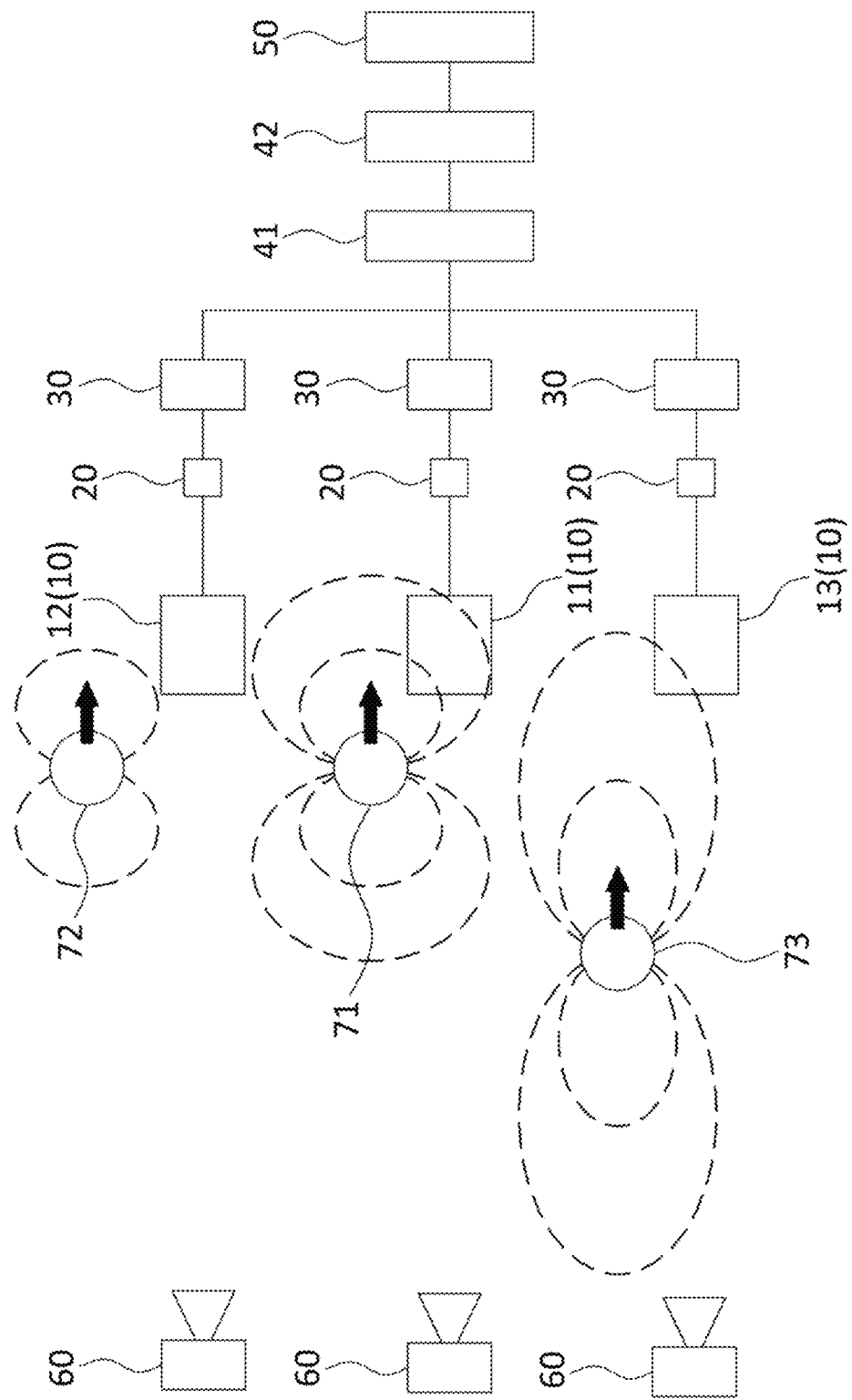
FIGS. 1 and 2 are schematic diagrams illustrating a metal detecting system according to an embodiment of the present invention.

The preferred embodiment according to the present invention includes: sensor modules that detect respective objects that move around the corresponding sensor modules, each sensor module having one or more sensors that include respective housings having respective inner spaces, respective cores formed to be inserted into the inner spaces of the housings, and respective coils which are each wound around a portion of an outer circumferential surface of each of the housings, the portion corresponding to a position of each of the cores; imaging units that image the respective objects which move around the corresponding sensor modules and image respective persons possessing the respective objects; impedance matching units that are connected to a plurality of the sensor modules, respectively, and perform impedance matching; and amplifiers that are connected to the impedance matching units, respectively, and amplify a fine current and voltage generated during approach of the objects to the sensor modules. The sensor modules have respective induced magnetic fields formed due to a change in distance from the objects containing iron (Fe). The objects are analyzed using information acquired by the sensor modules and captured images acquired by the imaging units.

EMBODIMENTS

Hereinafter, the present invention will be described with reference to the accompanying drawings. However, the present invention can be realized as various different examples and, thus, is not limited to embodiments described here. Further, a part irrelevant to the description is omitted from the drawings in order to clearly describe the present invention, and similar reference signs are assigned to similar parts through the entire specification.

In the entire specification, a case where a certain part "is connected to (accesses, is in contact with, or is coupled to)" another part means not only a case where the parts are "directly connected" to each other, but also a case where the parts are "indirectly connected" to each other with another member interposed therebetween. In addition, when a certain part "comprises" a certain configurational element, this means that another configurational element is not excluded, but the certain configurational element can be further included unless specifically described otherwise.

Terms used in this specification are only used to describe a specific embodiment and are not intentionally used to limit the present invention. A word having a singular form also includes a meaning of its plural form, unless obviously implied otherwise in context. In this specification, a term such as "to comprise" or "to have" is construed to specify that a feature, a number, a step, an operation, a configurational element, a part, or an assembly thereof described in the specification is present and not to exclude presence or a possibility of addition of one or more other features, numbers, steps, operations, configurational elements, parts, or assemblies thereof in advance.

Hereinafter, the present invention will be described in detail with reference to the accompanying drawings.

Figure 2:
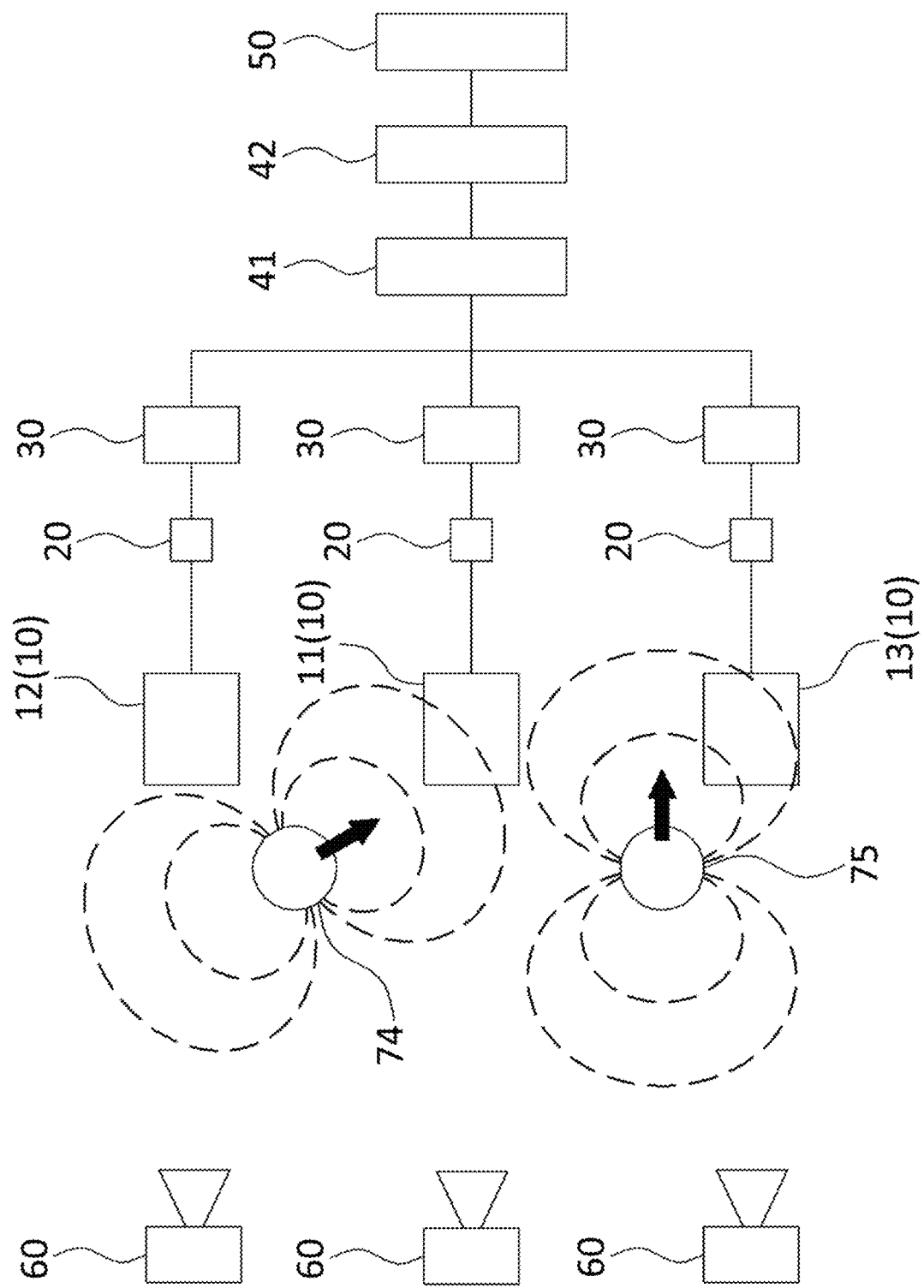
Figure 3:
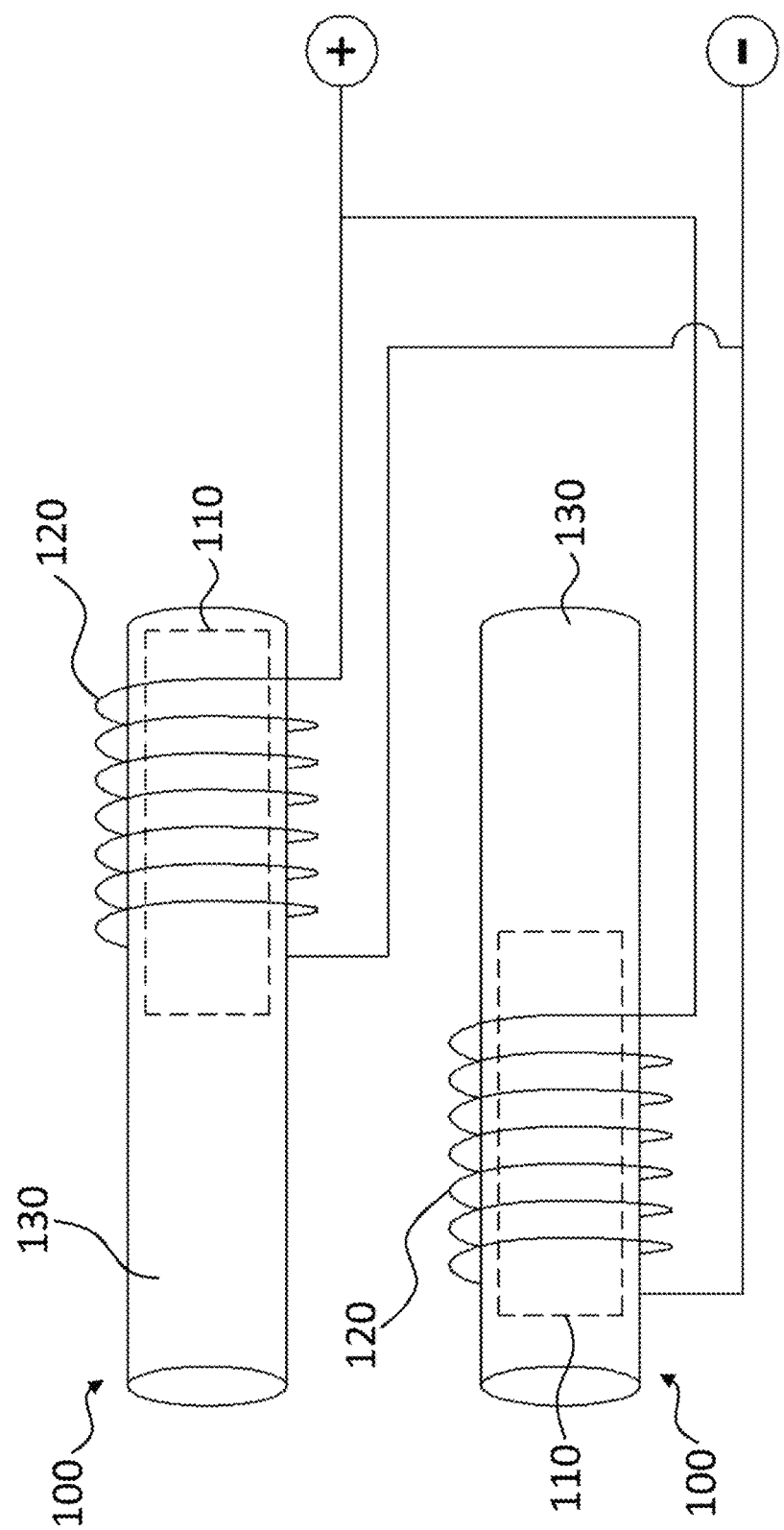
FIG. 3 is a schematic diagram illustrating a sensor according to a first embodiment of the present invention.
Figure 4:
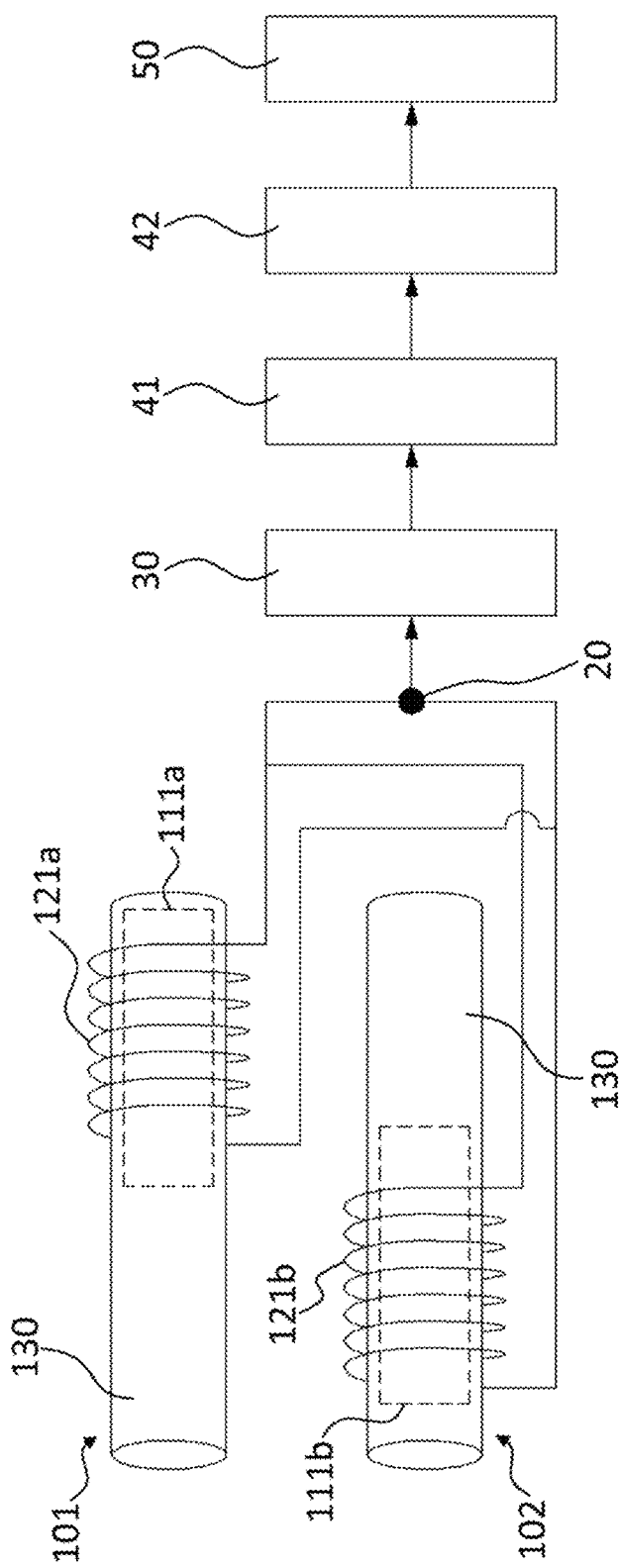
FIG. 4 is a schematic diagram illustrating a sensor module according to the first embodiment of the present invention.
Figure 5:
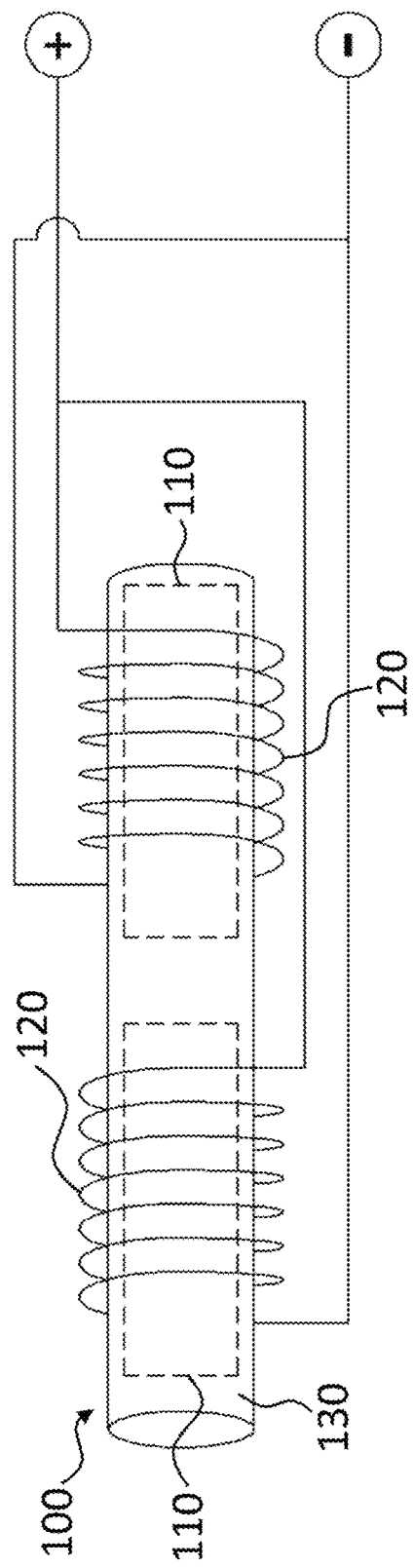
FIG. 5 is a schematic diagram illustrating a sensor according to a second embodiment of the present invention.
Figure 6:
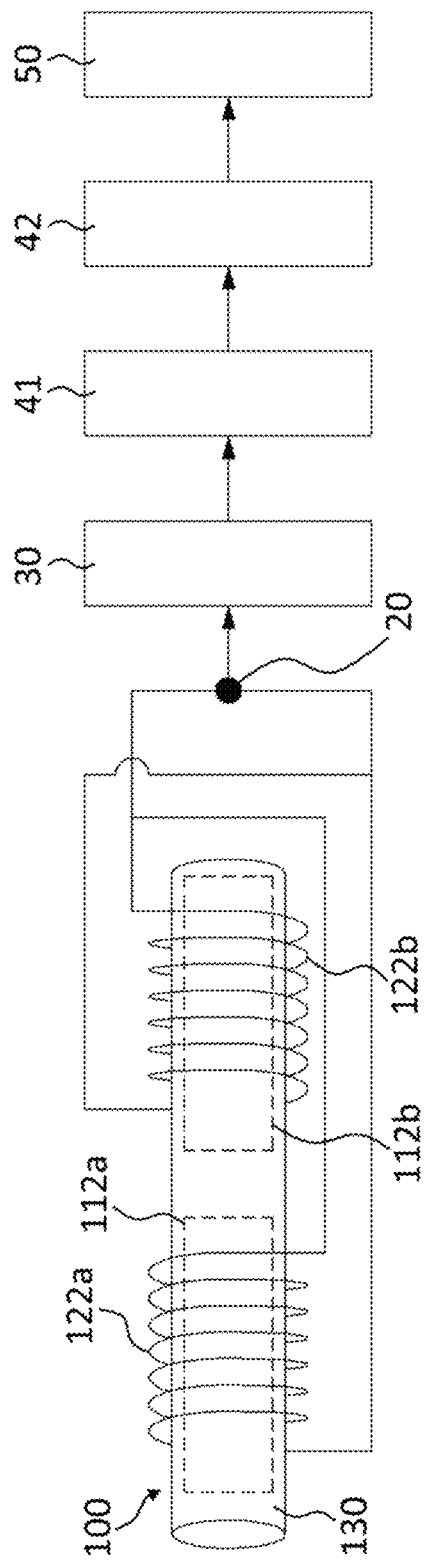
FIG. 6 is a schematic diagram illustrating a sensor module according to the second embodiment of the present invention.
Figure 7:
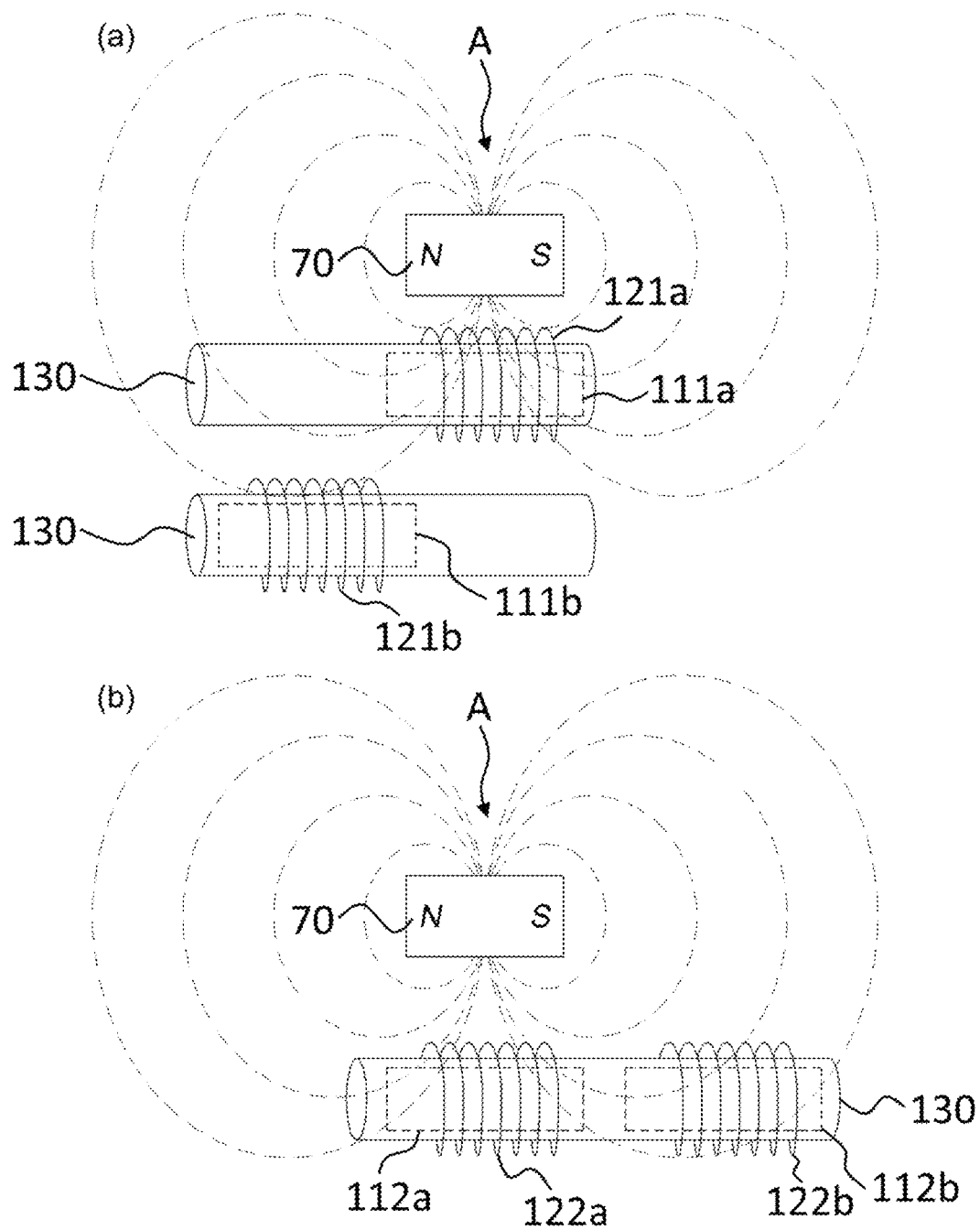
FIG. 7 is a schematic diagram illustrating magnetic field regions of the sensors according to the embodiments of the present invention.
Figure 9:
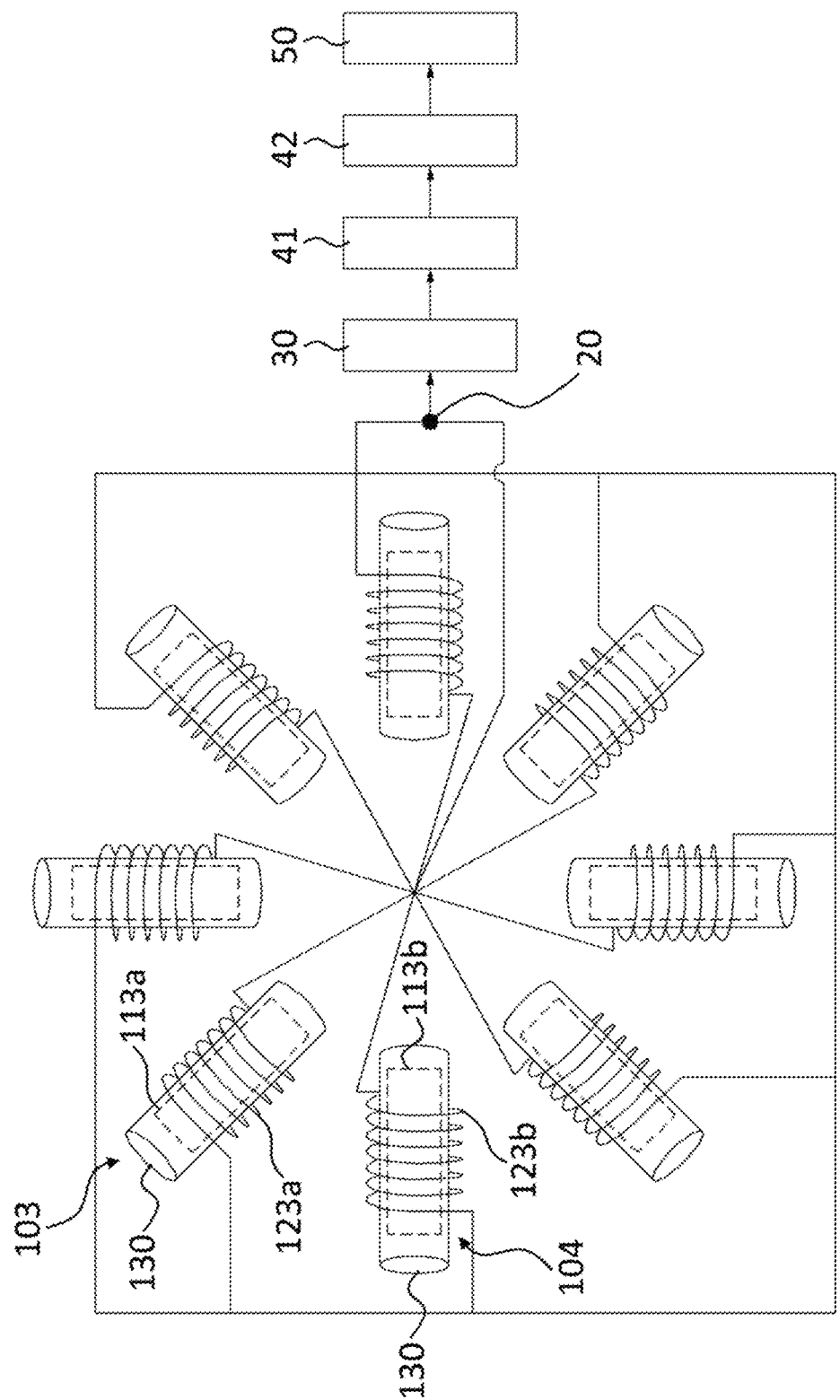
FIG. 9 is a schematic diagram illustrating a sensor module according to the third embodiment of the present invention.

FIGS. 1 and 2 are schematic diagrams illustrating a metal detecting system according to an embodiment of the present invention. In addition, FIG. 3 is a schematic diagram illustrating a sensor 100 according to a first embodiment of the present invention, and FIG. 4 is a schematic diagram illustrating a sensor module 10 according to the first embodiment of the present invention. In addition, FIG. 5 is a schematic diagram illustrating a sensor 100 according to a second embodiment of the present invention, and FIG. 6 is a schematic diagram illustrating a sensor module 10 according to the second embodiment of the present invention. Further, FIG. 7 is a schematic diagram illustrating magnetic field regions of the sensors 100 according to the embodiments of the present invention. Here, (a) of FIG. 7 is a diagram illustrating a state where an object 70 containing iron (Fe) moves with respect to the sensor module 10 according to the first embodiment of the present invention, and (b) of FIG. 7 is a diagram illustrating a state where the object 70 containing iron (Fe) moves with respect to the sensor module 10 according to the second embodiment of the present invention. Directions can be set based on right, left, top, and bottom of the drawings. Hereinafter, the same is true of the following. In the drawings of the present invention, the object 70 containing iron (Fe) has marks of the N pole and the S pole; however, the marks are only provided for the convenience of understanding, and the marks do not indicate that the object 70 is a magnet or an electromagnet. In FIGS. 4, 6, and 9, a first control unit 41 and a second control unit 42 are connected by an arrow; however, the arrow only means signal transmission and does not mean that the first control unit 41 and the second control unit 42 are formed separately from each other for each sensor module 10.

As illustrated in FIGS. 1 and 2, the metal detecting system of the present invention includes sensor modules 10 that detect respective objects 70 that move around the corresponding sensor modules, each sensor module having one or more sensors 100 that include respective housings 130 having respective inner spaces, respective cores 110 formed to be inserted into the inner spaces of the housings 130, and respective coils 120 which are each wound around a portion of an outer circumferential surface of each of the housings 130, the portion corresponding to a position of each of the cores 110; imaging units 60 that image the respective objects 70 that move around the corresponding sensor modules 10 and image respective persons possessing the respective objects 70; impedance matching units 20 that are connected to a plurality of the sensor modules 10, respectively, and perform impedance matching; and amplifiers 30 that are connected to the impedance matching units 20, respectively, and amplify a fine current and voltage generated during approach of the objects 70 to the sensor modules 10.

The sensor modules 10 can have respective induced magnetic fields formed due to a change in distance from the objects 70 containing iron (Fe). That is, the sensors 100 can have respective induced magnetic fields formed due to a change in distance from the objects 70 containing iron (Fe). This is because the object 70 containing iron (Fe) can have a fine magnetic field due to a property of the iron (Fe) having magnetism, and a movement or direction change of the object 70 containing iron (Fe) can cause the induced magnetic field to be formed in the sensor 100.

Specifically, the core 110 does not contain any magnetic component, and the induced magnetic field can be formed in the sensor 100 due to an approach or separation of the magnetic field of the object 70 containing iron. Further, the generation of the induced magnetic field can cause a fine current and voltage to be generated in the coil 120. That is, the configuration described above enables a magnetic flux quantity having an effect on the core 110 to be detected whenever a location or a direction of the object 70 containing iron (Fe) is changed, even when the core 110 is affected by a nano scale of flux quantity from the object 70 containing iron (Fe) or a magnetic field formed by the object 70 containing iron (Fe) has a magnetic flux density of equal to or smaller than several milligauss.

In order to fulfil a function described above, the core 110 can have good hysteresis characteristics and relatively high permeability. Specifically, in order to form the core 110, metal powder is mixed in proportion of 4.6 to 5.2 wt. % of iron (Fe), 74.3 to 75.6 wt. % of nickel (Ni), 12.5 to 13 wt. % of silicon (Si), 1.5 to 1.6 wt. % of chromium (Cr), and 5.8 to 5.9 wt. % of cobalt (Co) and is molded through the injection molding at a temperature of 1,300° C. or higher into a ribbon (or tape) shape having a thickness of 0.025 mm or smaller considering the permeability and impact having an effect on remote sensing, and a thin and lightweight core can be obtained. In addition, a plurality of thin cores 110 formed as described above can be configured to be overlapped and integrated with each other.

Here, since a nickel content accounts for a significant percent by weight in the core 110, it is important for nickel to be inhibited from dissolving at a low temperature. In addition, since a magnetic characteristic (hysteresis) of cobalt is degraded at a temperature of 1,200 to 1,300° C., it is important not to perform the injection molding at a temperature of 1,300° C. or higher. In addition, since the injection molding is vulnerable to impact, the injection molding has to be performed at a low injection speed and quenched at 106° C./sec such that the core 110 can have durability.

When a plurality of types of metal powder are mixed as described above, the mixed powder is heterogeneous, and thus particles can be arranged by providing a strong magnetic field while a heat treatment of heating the particles at a certain temperature is performed until the particles dissolve, so as for the particles of the mixed powder to maintain an arranged state in a certain direction. In addition, in order for the particles to maintain the arranged state, the core 110 formed in a process described above can be gradually cooled while being located in a magnetic field to be subjected to a magnetic field process. Accordingly, the hysteresis and the permeability of the core 110 can be increased.

As the characteristics of the core 110 becomes better when the thickness is thinner and the core 110 has to be lightweight so as to withstand impact, the core 110 made of an amorphous type of or permalloy metal is preferable; however, the permalloy metal has a higher degree of change due to impact than the amorphous metal does, and thus the amorphous core 100 can be used in the metal detecting system of the present invention.

The housing 130 can be formed into a cylindrical shape having an inner space, and the housing 130 can be made of an insulation material. In addition, the core 110 which is a passage of magnetic flux induced by the coil 120 can be formed in the inner space of the housing 130 corresponding to a position of the coil 120. Further, the coil 120 can be made of a metal wire such as an iron wire, a nichrome wire, or a copper wire.

The metal detecting system of the present invention can measure movement of one or more objects 70. Further, the metal detecting system can measure the number and a magnetic flux density of the objects 70, as well as a location, a direction, a speed, or the like related to the movement of the objects 70. In this respect, the plurality of sensor modules 10 can be formed, and the impedance matching units 20 and the amplifiers 30 can be connected to the plurality of sensor modules 10, respectively.

In addition, the metal detecting system of the present invention can further include: a first control unit 41 that is connected to the amplifiers 30 and analyzes a waveform of the amplified current and voltage; and a second control unit 42 that is connected to the first control unit 41 to generate analysis information of objects 70 by analyzing movement and magnetic flux density of the objects 70 and is connected to the imaging units 60 to collect the captured images.

In the embodiment of the present invention, the sensor modules 10 (first to third sensor modules) are described to be arranged side by side at regular intervals; however, arrangement thereof is not limited thereto, and the arrangement of the sensor modules 10 can be modified depending on a use of the metal detecting system of the present invention.

As illustrated in FIGS. 1 and 2, the metal detecting system of the present invention can analyze movement paths, movement speeds, or the like using locations, directions, and speeds of the plurality of objects 70, respectively, and can analyze relative movement between one object 70 and another object 70.

As a specific embodiment, as illustrated in FIG. 1, a first object 71 possessed by a first person can move from left to right on the drawing toward a space between a first sensor module 11 and a second sensor module 12, a second object 72 possessed by a second person can move toward a space above the second sensor module 12 based on the drawing, and a third object 73 possessed by a third person can move toward a space between the first sensor module 11 and a third sensor module 13.

In the description of the embodiment of the present invention, the persons possess the respective objects 70 and move, and the imaging units 60 image the respective persons; however, only the objects 70 are illustrated in FIGS. 1 and 2 for the convenience of understanding. The objects 70 can be possessed inside or outside clothes of the persons.

Hereinafter, generation of analysis information of the objects 70 through measurement of the movement, the number, the magnetic flux density, or the like of the objects 70 will be described, the measurement being performed by the sensor modules 10.

The first object 71 can have a magnetic flux density of $5 \times 10^{-17}$ T (Tesla) and a speed of 4 km/h (normal walking speed of a person), the second object 72 can have a magnetic flux density of $3 \times 10^{-17}$ T (Tesla) and a speed of 4 km/h, and the third object 73 can have a magnetic flux density of $5 \times 10^{-17}$ T (Tesla) and a speed of 6 km/h.

Further, as illustrated in FIG. 2, a fourth object 74 possessed by a fourth person can move in a direction from the second sensor module 12 toward the first sensor module 11, and a fifth object 75 possessed by a fifth person can move toward the first sensor module 11 and the third sensor module 13. Here, the fourth object 74 can have a magnetic flux density of $5 \times 10^{-17}$ T (Tesla) and a speed of 4 km/h, and the fifth object 75 can have a magnetic flux density of $5 \times 10^{-17}$ T (Tesla) and a speed of 6 km/h.

First, in analysis of the number of objects 70, when the first object 71, the second object 72, and the third object 73 move as described above, sensors 100 of the first sensor module 11, the second sensor module 12, and the third sensor module 13 can generate signals depending on movements of the objects 70, respectively, and all of the signals of the sensors 100 can be transmitted to the first control unit 41 through the impedance matching units 20 and the amplifiers 30 connected to the respective sensor modules 10. The first control unit 41 can analyze a plurality of such signal patterns, thereby, determining the number of objects 70 which pass adjacent to the respective sensor modules 10. The first control unit 41 stores data of respective signal patterns based on magnetic flux densities and speeds of the objects 70 and data of a compound pattern obtained when two or more signal patterns are superimposed, and the first control unit 41 can calculate the number of unique signal patterns of the objects 70 by analyzing the respective signal patterns, thereby analyzing the number of objects 70 which pass by the metal detecting system of the present invention. Here, data of the signal patterns or the compound patterns can be stored through experiments. However, another technology in the related art can be used as a signal separating technology for identifying the objects 70.

This can be also applied to a case where the fourth object 74 and the fifth object 75 move. As a result, through analysis performed by the first control unit 41, the objects 70 can be individually identified, and signal patterns of the objects 70 can be separated from each other.

In the description of the embodiment of the present invention, one person possesses one object 70; however, one person can possess two or more objects 70, or two or more persons can carry one object 70. That is, a possession relationship between persons and objects 70 is not limited. Accordingly, the number of objects 70 possessed by persons needs to be determined, and thus combined analysis performed by a linkage of the sensor modules 10 and the imaging units 60 can be performed using the imaging units 60 to be described below. This is to be described below in detail.

In the analysis of the movement paths, the movement speeds, and the magnetic flux densities of the objects 70, the objects 70 are individually identified by the signal pattern analysis performed by the first control unit 41, and respective signal patterns of the objects 70 can be transmitted to the second control unit 42. Further, the second control unit 42 can analyze the movement paths and the movement speeds of the objects 70 by analyzing the respective signal patterns.

Specifically, as illustrated in FIG. 1, when the first object 71, the second object 72, and the third object 73 move rectilinearly in one direction (reference direction), the objects 70 can be individually identified as described above, and thereby the signal patterns of the objects 70 can be separated from each other by the first control unit 41 and be transmitted to the second control unit 42. Here, the second control unit 42 can analyze that the objects 70 form respective signal patterns, each of which has certain strength, with respect to the respective sensor modules 10, thus determining that the first object 71, the second object 72, and the third object 73 move in the same direction and determining the magnetic flux densities and the movement speeds of the objects 70 based on the respective signal patterns of the objects 70. Here, similarly to the first control unit 41, the second control unit 42 can store data of respective signal patterns depending on the magnetic flux densities and the speeds of the objects 70, and the second control unit 42 can use the stored data.

Further, as illustrated in FIG. 2, when the fourth object 74 and the fifth object 75 move in respective directions different from each other, the objects 70 can be individually identified as described above, and thereby the signal patterns of the objects 70 can be separated from each other by the first control unit 41 and be transmitted to the second control unit 42. Here, the second control unit 42 can analyze a phenomenon in which the strength of a signal pattern of the fourth object 74 gradually increases in the first sensor module 11 and gradually decreases in the second sensor module 12, a pattern of a strength change thereof, or the like, thereby determining that the fourth object 74 moves to form a certain angle with respect to a reference direction (direction in which the fifth object 75 moves) and determining the magnetic flux density and the movement speed based on the signal pattern of the fourth object 74. The analysis of the movement of the fifth object 75 can be similar to the analysis of the first object 71 and the like described above.

Hereinafter, analysis of the objects 70 by using the information of the sensor modules 10 and the captured images will be described.

As illustrated in FIGS. 1 and 2, one or more of the imaging units 60 can be formed to acquire the captured images of the entirety of measurable regions of the sensor modules 10. The imaging units 60 can be variously arranged corresponding to the arrangement of the sensor modules 10. Further, any device such as a camera or an image sensor which can acquire an image can be used as the imaging unit 60.

The objects 70 can be analyzed using the information acquired by the sensor modules 10 and the captured images as images acquired by the imaging units 60. In this respect, the second control unit 42 can categorize the objects 70 using the analysis information of the objects 70 and the captured images. Here, the second control unit 42 can determine whether or not the magnetic flux density of the objects 70 is within a predetermined magnetic flux density range and then determine types of objects 70 by analyzing the captured images. The analysis information of the objects 70 can include information of the number of objects 70, the movement paths and movement speeds of the objects 70, the magnetic flux density of the objects 70, or the like.

The second control unit 42 can discriminate between the objects 70 having respective magnetic flux densities within the predetermined magnetic flux density range. That is, the second control unit 42 can determine whether or not a specific object 70 passes by the metal detecting system of the present invention. Specifically, as described above, the first control unit 41 can identify the individual objects 70, separate the signal patterns of the individual objects 70, and transmit the separated signal patterns to the second control unit 42, and the second control unit 42 can analyze the transmitted signal patterns of the objects 70 to determine whether a magnetic flux density of a corresponding object 70 is within a predetermined magnetic flux density range. That is, since the objects 70 passing by the metal detecting system can have respective different amounts of iron component so as to have respective different magnetic flux densities and the magnetic flux density of a category of a specific object 70 can be within the predetermined magnetic flux density range, the second control unit 42 can determine whether an object 70 belongs to the category of the specific object 70 using the magnetic flux density of the object 70.

Specifically, firearms can contain a relatively high density of iron component due to a forging process, thus having a relatively high magnetic flux density. Accordingly, the magnetic flux density of the firearms can form a predetermined magnetic flux density, and the second control unit 42 can discriminate an object 70 as a firearm when a magnetic flux density of the corresponding object 70 is within a magnetic flux density of the firearms.

However, when discrimination between the objects 70 is performed only using the magnetic flux density, an object 70 which is not a firearm but has a magnetic flux density within the magnetic flux density range of the firearms can be determined as the firearm. Hence, after primary analysis of a type of object 70 as described above, secondary analysis using captured images can be performed. Hereinafter, an object 70 which is categorized primarily as a firearm using the magnetic flux density can be referred as a suspected firearm object.

When the suspected firearm object is detected as described above, a captured image of the suspected firearm object or a person possessing the suspected firearm object can be transmitted to the second control unit 42 in real time. The second control unit 42 can store images of the objects 70 corresponding to various types of firearms, and thus the second control unit 42 can perform analysis by comparing the suspected firearm object and the stored image and definitively determine whether or not the suspected firearm object is a firearm.

However, a case of determination of the suspected firearm object using an instant captured image as described above can be a case where the suspected firearm object is exposed outside from a person possessing the corresponding object 70. On the other hand, in a state where the suspected firearm object is located inside the person possessing the corresponding object 70, that is, in a state where the suspected firearm object is hidden under clothes of the person, it is not possible to easily analyze by comparing an instant captured image and the image stored in the second control unit 42 as described above.

In such cases, the imaging unit 60 can have a heat detecting function. When the second control unit 42 does not detect a firearm on the captured image even though a suspected firearm object is detected, the second control unit 42 can transmit a control signal to the imaging unit 60, and the imaging unit 60 which received the control signal can start to operate the heat detecting function and collect a thermal image as a captured image of a person who is tracked due to a possibility of possession of a suspected firearm object. The thermal image can be transmitted to the second control unit 42, and the second control unit 42 can determine whether a firearm is hidden under clothes of the corresponding person. Here, even when a firearm is hidden under the clothes of the person, the shape of the firearm is shown due to a temperature difference during performing the thermal function of the imaging unit 60, and thereby the determination can be performed.

The second control unit 42 can generate an alarm signal when determining that the object 70 is a firearm. Further, the metal detecting system of the present invention can further include an output unit 50 that is connected to the second control unit 42, visually outputs locational changes of the objects 70, and outputs the alarm signal.

The alarm signal can be transmitted to the output unit 50, and the alarm signal can be visually or audibly realized. Further, when the second control unit 42 definitively determines that the suspected firearm object is a firearm, the second control unit can transmit a captured image of a person possessing the corresponding object 70 to a security guard's communication device.

Further, the output unit 50 can receive information from the second control unit 42, display a three-dimensional coordinate change of the movement path of the object 70 on a graph, an image, or the like, and display numerical value information of the movement speed, the magnetic flux density, or the like of the object 70 on a screen.

As described above, a suspected firearm object is discriminated from a plurality of objects 70 primarily using the magnetic flux density, the location of the discriminated suspected firearm object (or person possessing the corresponding object 70) is tracked, and, secondarily, analysis of the suspected firearm object is performed using the analysis information of the object 70 and the captured image of the suspected firearm object. In this manner, a detection speed of a firearm object 70 can be remarkably improved.

Further, since measurement of the object 70 can be performed using a combination of the analysis information of the object 70 acquired by the sensor modules 10 and the captured images acquired by the imaging unit 60, the measurement accuracy of the object 70 can be improved.

In the embodiment of the present invention, discrimination between the firearm objects 70 is specifically described; however, the types of discriminated objects 70 are not limited to the firearms, and the same principle of discrimination can be used for another object 70.

Figure 8:
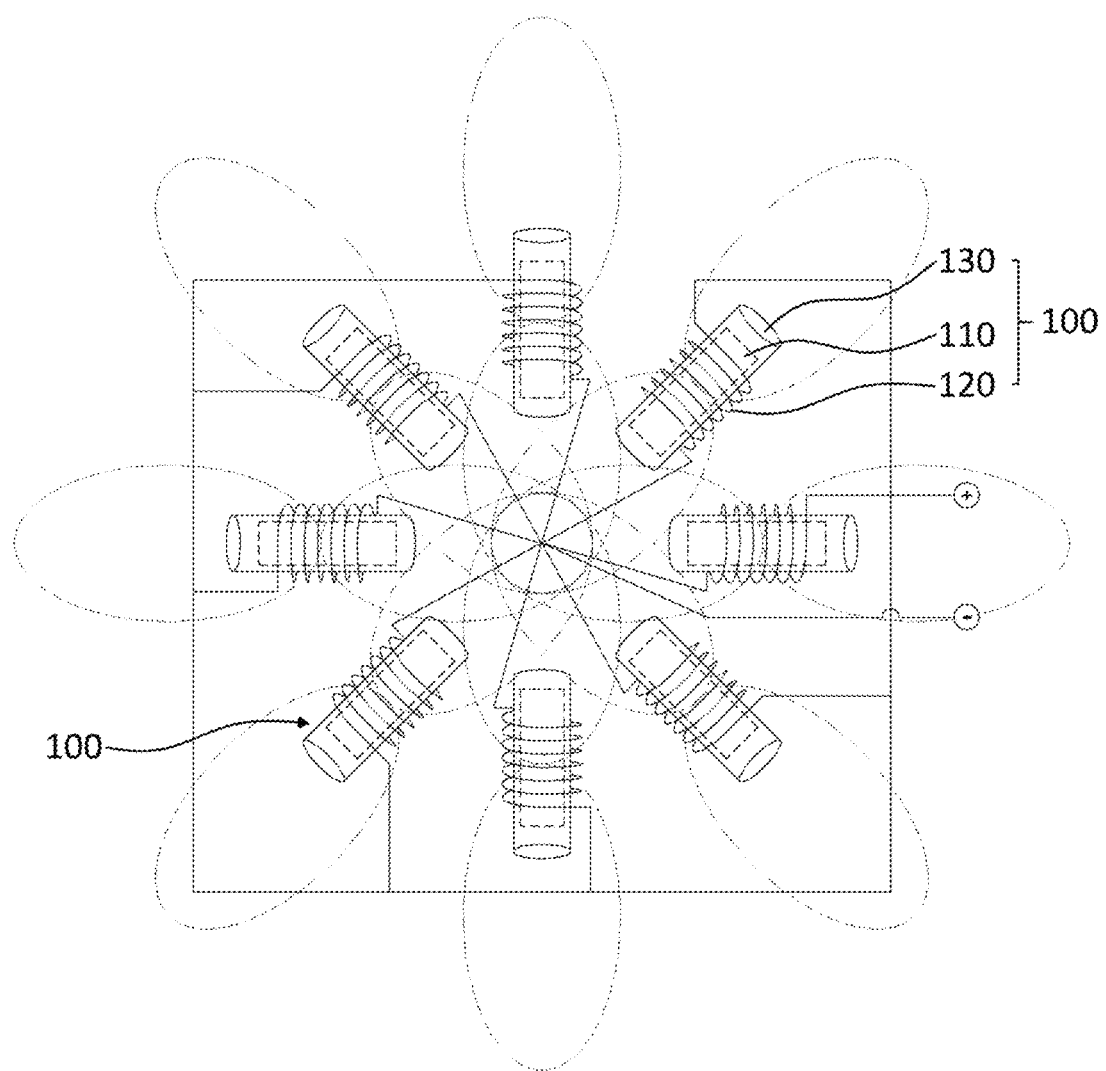
FIG. 8 is a schematic diagram illustrating a sensor according to a third embodiment of the present invention.
Figure 10:
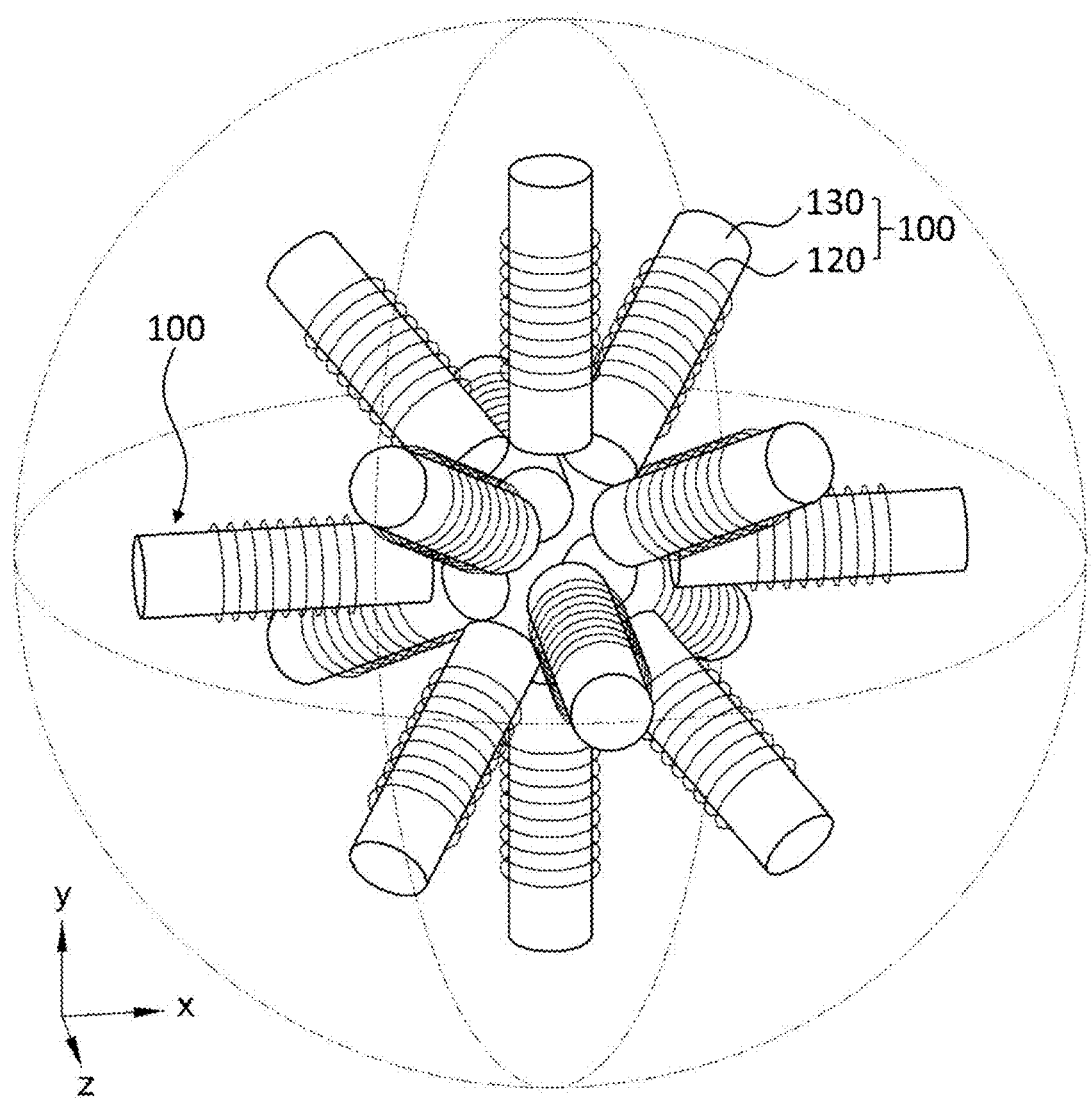
FIG. 10 is a schematic diagram illustrating a sensor module according to a fourth embodiment of the present invention.

Hereinafter, installation of the sensors 100 included in the sensor module 10 will be described. FIG. 8 is a schematic diagram illustrating a sensor 100 according to a third embodiment of the present invention, and FIG. 9 is a schematic diagram illustrating a sensor module 10 according to the third embodiment of the present invention. Further, FIG. 10 is a schematic diagram illustrating a sensor module 10 according to a fourth embodiment of the present invention.

As illustrated in FIGS. 3, 4, and 7 to 10, a plurality of sensors 100 can be arranged in parallel or radially with each other. First, a case where the plurality of sensors 100 are arranged in parallel with each other is to be described.

As illustrated in FIGS. 3 and 4, the plurality of sensors 100 can be arranged in parallel with each other, and a position of a core 110 and a coil 120 with respect to one housing 130 can differ from a position of a core 110 and a coil 120 with respect to another housing 130. Specifically, of the plurality of sensors 100, a 1-1st sensor 101 and a 1-2nd sensor 102 can be formed in parallel to be positioned side by side, a 1-1st core 111a and a 1-1st coil 121a can be formed at a right portion of the first sensor 100, and a 1-2nd core 111b and a 1-2nd coil 121b can be formed at a left portion of the second sensor 10.

As illustrated in FIGS. 3, 4, and 7, when the object 70 containing iron (Fe) moves to approach the sensor 100 from the left side to the right side of the drawings, a change in magnetic field momentarily occurs in the core 110, and thus a fine voltage and current can be induced to be generated in the coil 120. In this case, when a non-polarity part (represented by Reference sign A in FIG. 7) as a part in which N pole and S pole of the object 70 containing iron (Fe) is switched passes by the 1-1st core 111a, the generation of the voltage and the current induced by the 1-1st core 111a and the 1-1st coil 121a provided in the 1-1st sensor 101 can be stopped. Here, not only when a magnetic line of force does not affect the 1-1st core 111a and the 1-1st coil 121a at all due to the non-polarity part, but also when the magnetic line of force partially affects the 1-1st core 111a and the 1-1st coil 121a as illustrated in FIG. 7, the magnetic flux density can be remarkably reduced in the vicinity of the non-polarity part such that generation of an induced voltage and current can be stopped.

On the other hand, at the same time, since the 1-2nd core 111b and the 1-2nd coil 121b provided in the 1-2nd sensor 102 are affected by distortion of a magnetic field through the N or S pole which is generated by the object 70 containing iron (Fe), that is, affected by magnetic field movement of the object 70 containing iron (Fe), a fine voltage and current can be induced in the 1-2nd coil 121b.

Further, one end of a coil 120 provided in one sensor 100 can be connected to one end of a coil 120 provided in another sensor 100, and the other end of the coil 120 provided in the one sensor 100 can be connected to the other end of the coil 120 provided in the other sensor 100. Accordingly, a lead wire of the one sensor 100 and a lead wire of the other sensor 100 can be connected to have the same signal.

Specifically, when an induced magnetic field is generated to the core 110 and the coil 120 (the 1-1st core 111a and the 1-1st coil 121a) provided in the one sensor 100 and the core 110 and the coil 120 (the 1-2nd core 111b and the 1-2nd coil 121b) provided in the other sensor 100, a fine current and voltage can be generated in the coil 120 provided in the one sensor 100 such that a + pole and a − pole can be formed therein, and similarly, a fine current and voltage can be formed in the coil 120 provided in the other sensor 100 such that a + pole and a − pole can be formed therein. In this case, the + pole of the coil 120 provided in the one sensor 100 can be connected to the + pole of the coil 120 provided in the other sensor 100, and the − pole of the coil 120 provided in the one sensor 100 can be connected to the − pole of the coil 120 provided in the other sensor 100.

Even when the non-polarity part of the object 70 containing iron (Fe) passes by the one sensor 100 as described above, and the generation of the current and the voltage is stopped in the coil 120 provided in the one sensor 100, the connection of the same signal as described above enables the current and the voltage to be generated in the coil 120 provided in the other sensor 100 such that the sensor 100 can be continuously and normally operated.

The impedance matching units 20 can be connected to lead wires connected to the plurality of coils 120, respectively, and perform impedance matching. The impedance matching unit 20 can maximize a signal transmission efficiency by reducing a loss of signal by reducing reflection due to an impedance difference between signals (fine current or voltage) transmitted from both ends of each of the sensors 100. Further, the amplifier 30 can include an amplification circuit for amplifying a transmitted signal, amplify the signal transmitted from the impedance matching unit 20, and transmit the amplified signal to the first control unit 41.

The first control unit 41 can determine whether displacement occurred to the object 70 containing iron (Fe) or displacement occurred to the sensor modules 10 by analyzing a waveform of an amplified signal.

The first control unit 41 can be realized by a signal processing module such as a microcomputer or an FPGA, and a software algorithm (SW algorithm) can be applied thereto. The SW algorithm can determine whether the displacement occurred to the object 70 containing iron (Fe), the sensor 100 provided in the sensor module 10, or both the object and the sensor based on a difference in information of a signal pattern obtained during the occurrence of displacement to the sensor 100 and a signal pattern obtained during movement of the object 70 containing iron (Fe).

Specifically, since the sensors 100 respond to a fine magnetic field, in a case where the displacement occurred to the sensor 100, the signal pattern can be formed by being affected by a change in magnetic field of the Earth, magnetic field of another object 70 around the sensor, or the like, in addition to a magnetic field change due to the occurrence of relative displacement of the sensor 100 with respect to the object 70 containing iron (Fe), while in a case where the displacement occurred to the object 70 containing iron (Fe), the sensor 100 is affected only by a change in magnetic field due to the occurrence of the relative displacement with respect to the object 70 containing iron (Fe). Hence, different signal patterns can be formed depending on both the cases. Further, similarly, in a case where displacement occurred to the object 70 containing iron (Fe) and the sensors 100 simultaneously, another signal pattern can be formed.

As described above, different signal pattern can be formed depending on cases, and the signal patterns formed for each cases can be stored in the first control unit 41 and form reference data. Here, the signal pattern stored in the reference data of the first control unit 41 can be experimentally derived. The first control unit 41 can analyze similarity or the like by determining through comparison between a signal pattern transmitted from the amplifier 30 and the signal pattern in the reference data of the first control unit 41, thereby performing determination of whether the displacement occurred to the object 70 containing iron (Fe) or the sensors 100.

The second control unit 42 can receive, from the first control unit 41, information of whether the displacement occurred to the object 70 containing iron (Fe) or the displacement occurred to the sensors 100 and data of a waveform of the signal pattern and analyze an actual displacement path of a displaced agent. The second control unit 42 can be realized by a signal processing module such as a microcomputer or an FPGA, and a software algorithm (SW algorithm) can be applied thereto.

Specifically, the signal pattern for the occurrence of displacement of the object 70 containing iron (Fe), the signal pattern of the occurrence of displacement of the sensor 100, or the signal pattern of the simultaneous occurrence of displacement of the object 70 containing iron (Fe) and the sensor 100 can be all stored in the second control unit 42 and form reference data. Here, the signal patterns stored in the reference data of the second control unit 42 can be experimentally derived.

The second control unit 42 can first confirm a displaced agent based on the information transmitted from the first control unit 41, select a data category related to a displaced agent from the reference data of the second control unit 42, and then analyze similarity by determining through comparison between the waveform of the signal pattern transmitted from the first control unit 41 and the signal pattern in the reference data of the second control unit 42, thereby, performing a coordinate change based on the occurrence of the displacement of the object 70 containing iron (Fe), a coordinate change based on the occurrence of the displacement of the sensors module 10, or the like.

In the embodiment of the present invention, the first control unit 41 and the second control unit 42 are described to be sequentially connected to each other; however, connection thereof is not limited thereto, and the first control unit 41 and the second control unit 42 can be configured simultaneously or independently.

That is, as described above, the first control unit 41 can determine whether the displacement occurred to the object 70 or the sensor module 10 in addition to identifying the object 70 by separating the signal patterns, the second control unit 42 can analyze the movement path and the movement speed of an object 70 and simultaneously analyze a movement path of the sensor module 10.

Next, a case where the plurality of sensors 100 are arranged radially with each other is to be described. In FIGS. 8 and 10, regions enclosed by two-dot chain lines may indicate measurable regions (ranges) of the sensors 100 corresponding to the respective regions.

In FIGS. 8 and 10, for the convenience of understanding, the measurable regions of the sensors 100 are illustrated to be rather small; however, the measurable region is not limited thereto, and the measurable regions of the sensors 100 can be formed to be larger. Further, in FIG. 10, for the convenience of understanding, connection or the like of lead wires is omitted, and only arrangement of the sensors 100 is illustrated.

As illustrated in FIGS. 8 to 10, the plurality of sensors 100 can be radially arranged. Specifically, of the plurality of sensors 100, a 3-1st sensor 103 and a 3-2nd sensor 104 can be radially formed (other sensors 100 are also radially formed; however, for the convenience of understanding, only the 3-1st sensor 103 and the 3-2nd sensor 104, to which Reference signs are assigned, are to be described).

As described above, when the plurality of sensors 100 are radially arranged, the measurable regions of the plurality of sensors 100 can be formed to be contiguous to each other or to intersect with each other such that the detection efficiency of the object detected by the metal detecting system of the present invention can be remarkably improved. In particular, as illustrated in FIG. 10, when the plurality of sensors 100 are arranged in a three-dimensionally radial shape, the measurable regions of the plurality of sensors 100 can be formed into spherical shapes. Hence, not only can the detection efficiency be increased as described above, but also an advantage of easy detection of the object can be obtained even when the object moves toward any of an x axis, a y axis, and a z axis. Further, when the sensors 100 are separately disposed from each other, arrangement with consideration for the measurable regions of the sensors 100 may not be easy. However, when the metal detecting system of the present invention which is formed as described above, in which the plurality of sensors 100 are radially arranged, is used, the measurable regions can be formed into a cylindrical shape, a spherical shape, or the like, and thereby the measurable regions can be easily calculated such that detection region design of the object can be easily performed.

As illustrated in FIGS. 8 to 10, when the object 70 containing iron (Fe) moves to approach the sensor 100 from the left side to the right side of the drawings, a change in magnetic field momentarily occurs in the core 110, and thus a fine voltage and current can be induced and formed in the coil 120. In this case, when the non-polarity part as a part in which N pole and S pole of the object 70 containing iron (Fe) is switched passes by a 3-1st core 113a, the generation of the voltage and the current induced by the 3-1st core 113a and a 3-1st coil 123a provided in the 3-1st sensor 103 can be stopped. Here, not only when a magnetic line of force does not affect the 3-1st core 113a and the 3-1st coil 123a at all due to the non-polarity part, but also when the magnetic line of force partially affects the 3-1st core 113a and the 3-1st coil 123a, the magnetic flux density can be remarkably reduced in the vicinity of the non-polarity part such that generation of an induced voltage and current can be stopped.

On the other hand, at the same time, since the 3-2nd core 113b and the 3-2nd coil 123b provided in the 3-2nd sensor 104 are affected by distortion of a magnetic field through the N or S pole which is generated by the object 70 containing iron (Fe), that is, affected by magnetic field movement of the object 70 containing iron (Fe), a fine voltage and current can be induced in the 3-2nd coil 123b.

Further, one end of a coil 120 provided in one sensor 100 can be connected to one end of a coil 120 provided in another sensor 100, and the other end of the coil 120 provided in the one sensor 100 can be connected to the other end of the coil 120 provided in the other sensor 100. Accordingly, a lead wire of the one sensor 100 and a lead wire of the other sensor 100 can be connected to have the same signal.

Specifically, when an induced magnetic field is generated to the core 110 and the coil 120 (the 3-1st core 113a and the 3-1st coil 123a) provided in the one sensor 100 and the core 110 and the coil 120 (the 3-2nd core 113b and the 3-2nd coil 123b) provided in the other sensor 100, a fine current and voltage can be generated in the coil 120 provided in the one sensor 100 such that a + pole and a − pole can be formed therein, and similarly, a fine current and voltage can be formed in the coil 120 provided in the other sensor 100 such that a + pole and a − pole can be formed therein. In this case, the + pole of the coil 120 provided in the one sensor 100 can be connected to the + pole of the coil 120 provided in the other sensor 100, and the − pole of the coil 120 provided in the one sensor 100 can be connected to the − pole of the coil 120 provided in the other sensor 100.

Even when the non-polarity part of the object 70 containing iron (Fe) passes by the one sensor 100 as described above and the generation of the current and the voltage is stopped in the coil 120 provided in the one sensor 100, the connection of the same signal as described above enables the current and the voltage to be generated in the coil 120 provided in the other sensor 100 such that the sensor 100 can be continuously and normally operated.

The description of the rest of the impedance matching units 20, the amplifiers 30, the first control unit 41, and the second control unit 42 is the same as the description of the impedance matching units 20, the amplifiers 30, the first control unit 41, and the second control unit 42 when the plurality of sensors 100 are arranged in parallel with each other.

As illustrated in FIGS. 5 to 6, the plurality of coils 120 provided in the sensor 100 can be arranged in series with each other. That is, in the sensor 100 provided in the sensor module 10, the plurality of coils 120 can be arranged in series with each other, and one core 110 can be formed to be separated from another core 110. Specifically, a 2-1st coil 122a and a 2-2nd coil 122b can be formed in series at one housing 130, and a 2-1st core 112a and a 2-2nd core 112b can be formed to correspond to the coils. Here, the sensor module 10 can include one or more sensors 100.

As illustrated in FIGS. 5, 6, and 7, when the object 70 containing iron (Fe) moves to approach the sensor 100 from the left side to the right side of the drawings, a change in magnetic field momentarily occurs in the core 110, and thus a fine voltage and current can be induced to be formed in the coil 120. In this case, when a non-polarity part (represented by Reference sign A in FIG. 7) as a part in which N pole and S pole of the object 70 containing iron (Fe) is switched passes by the 2-1st core 112a, the generation of the voltage and the current induced by the 2-1st core 112a and the 2-1st coil 122a can be stopped. Here, not only when a magnetic line of force does not affect the 2-1st core 112a and the 1-1st coil 122a at all due to the non-polarity part, but also when the magnetic line of force partially affects the 1-1st core 112a and the 2-1st coil 122a as illustrated in FIG. 7, the magnetic flux density can be remarkably reduced in the vicinity of the non-polarity part such that generation of an induced voltage and current can be stopped.

On the other hand, at the same time, since the 2-2nd core 112b and the 2-2nd coil 122b are affected by distortion of a magnetic field through the N or S pole which is generated by the object 70 containing iron (Fe), that is, affected by magnetic field movement of the object 70 containing iron (Fe), a fine voltage and current can be induced in the 2-2nd coil 122b.

Further, of the plurality of coils 120, one end of one coil 120 can be connected to one end of another coil 120, and the other end of the one coil 120 can be connected to the other end of the other coil 120. Accordingly, a lead wire of the one coil 120 and a lead wire of the other coil 120 can be connected to have the same signal.

Specifically, when an induced magnetic field is generated to one coil 120 (2-1st coil 122a) and another coil 120 (2-2nd coil 122b), a fine current and voltage can be formed in the one coil 120 such that a + pole and a − pole can be formed therein, and similarly, a fine current and voltage can be formed in the other coil 120 such that a + pole and a − pole can be formed therein. In this case, the + pole of the one coil 120 can be connected to the + pole of the other coil 120, and the − pole of the one coil 120 can be connected to the − pole of the other coil 120.

Even when the non-polarity part of the object 70 containing iron (Fe) passes by the one sensor 100 as described above and the generation of the current and the voltage is stopped in the coil 120 provided in the one sensor 100, the connection of the same signal as described above enables the current and the voltage to be generated in the coil 120 provided in the other sensor 100 such that the sensor 100 can be continuously and normally operated.

The description of the rest of the impedance matching units 20, the amplifiers 30, the first control unit 41, and the second control unit 42 is the same as the description of the impedance matching units 20, the amplifiers 30, the first control unit 41, and the second control unit 42 when the plurality of sensors 100 are arranged in parallel with each other.

In the embodiments of the present invention, the parallel arrangement of the sensors 100 in the sensor module 10 and the serial arrangement of the coils 120 in the sensor 100 are described separately from each other. However, the sensor module 10 can be formed to include a plurality of sensors 100 in which the coils 120 are arranged in series in one sensor 100, with the sensors 100 being arranged in parallel, and the coils 120 are provided at different respective positions with respect to each of the sensors 100 so as to inhibit an effect of the non-polarity part of the object 70 containing iron (Fe). Such a configuration and principle described above can also be applied to such a case described above in the same manner.

Figure 11:
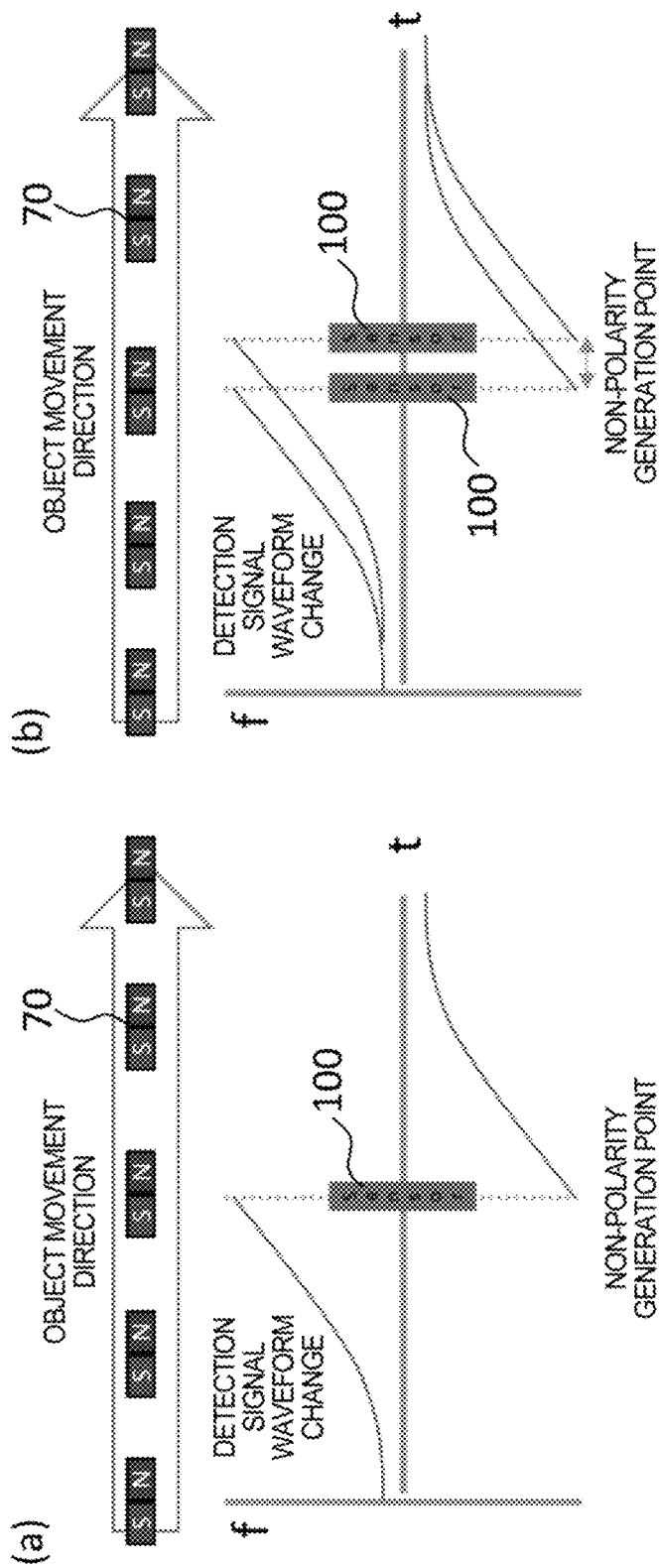
FIGS. 11 and 12 illustrate signal pattern graphs obtained in a state where an object passes by the sensor according to the first embodiment of the present invention.
Figure 12:
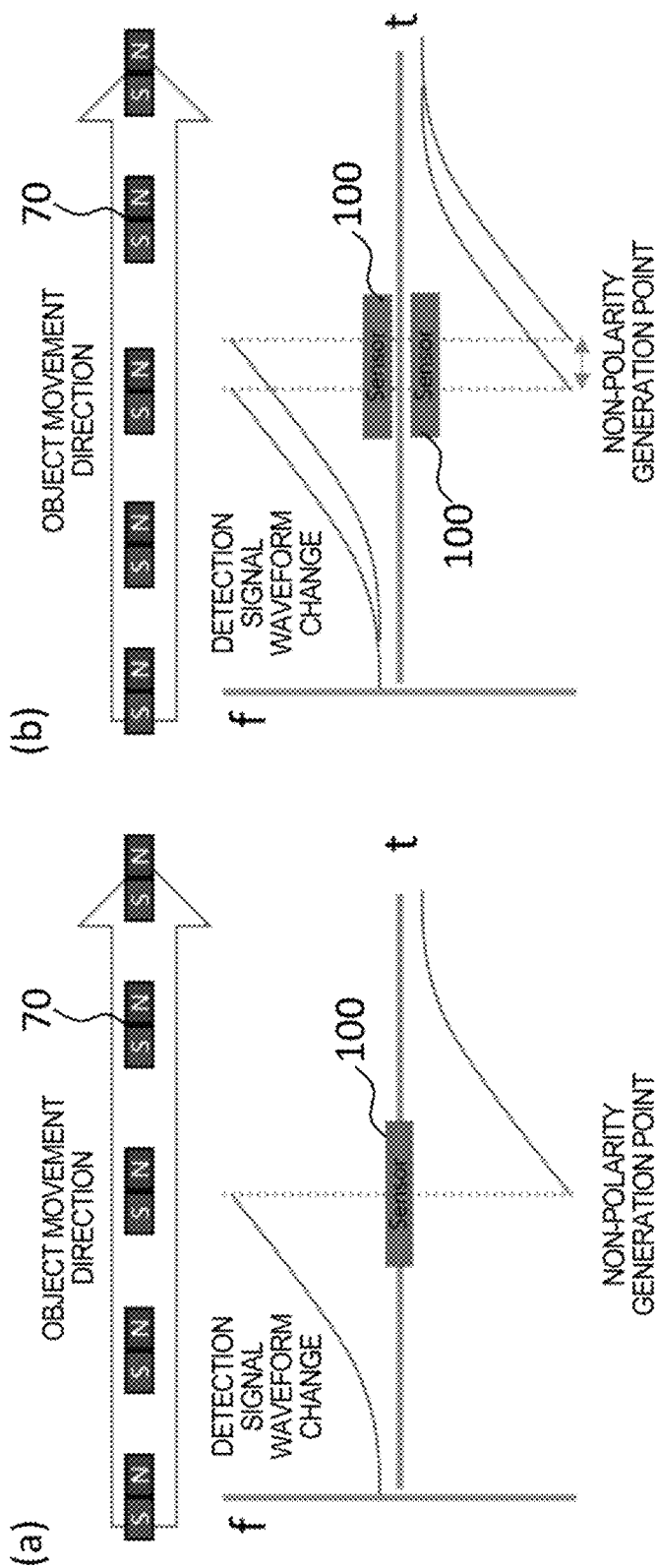

FIGS. 11 and 12 illustrate signal pattern graphs obtained in a state where the object 70 passes by the sensor 100 according to the first embodiment of the present invention. Specifically, (a) of FIG. 11 illustrates a graph obtained in a state where a single sensor 100 according to the first embodiment of the present invention is formed and a lengthwise axis of the sensor 100 is perpendicular to the ground, and (b) of FIG. 11 illustrates a graph obtained in a state where the sensors 100 according to the first embodiment of the present invention are arranged in parallel with each other and lengthwise axes of the sensors 100 are perpendicular to the ground. Further, (a) of FIG. 12 illustrates a graph obtained in a state where a single sensor 100 according to the first embodiment of the present invention is formed and a lengthwise axis of the sensor 100 is horizontal to the ground, and (b) of FIG. 12 illustrates a graph obtained in a state where the sensors 100 according to the first embodiment of the present invention are arranged in parallel with each other and lengthwise axes of the sensors 100 are horizontal to the ground.

As illustrated in FIGS. 11 and 12, when the metal detecting system of the present invention is used, it is possible to confirm easy performance of the detection of the object 70 by using the sensors 100 regardless of whether the lengthwise axis of the sensor 100 is perpendicular or horizontal to the ground. Further, as found in comparison between a case of using a single sensor 100 and a case of using the plurality of sensors 100 arranged in parallel with each other, the occurrence of displacement of the object 70 containing iron (Fe) can be normally and continuously measured regardless of the non-polarity part of the object 70 containing iron (Fe).

According to the above-described configuration, a fine change in magnetic field and flux quantity of the object 70 containing iron can be detected such that a position, displacement, or the like of the object 70 containing iron can be detected with ultra-low electric power. In addition, even when the non-polarity range as a range in which a magnetic field of the object 70 subsides is formed as described above, the magnetic field of the object 70 containing iron can be detected by another adjacent sensor 100 or coil 120 such that the sensor module 10 can be normally and continuously operated.

Further, as described above, an additional effect of an installation direction or the like of the sensor 100 with respect to the ground is minimized such that detection and measurement can be performed regardless of the arrangement of the sensor modules 10. In addition, when the metal detecting system of the present invention is formed by arranging the plurality of sensor modules 10, information of the movement path, the movement speed, the magnetic flux density, or the like of the object 70 containing iron can be determined to be used.

Further, since the metal detecting system of the present invention can detect a fine change in magnetic field and flux quantity of the object containing iron, the metal detecting system can exhibit the same performance regardless of an effect of air, soil, water, or the like.

The description of the present invention described above is provided as an example, and a person of ordinary skill in the art to which the present invention pertains can understand that it is possible to easily modify the present invention to another embodiment without changing the technical idea or an essential feature of the present invention. Therefore, the embodiments described above need to be understood as exemplified embodiments in every aspect and not as limiting embodiments. For example, the configurational elements described in singular forms can be realized in a distributed manner. Similarly, the configurational elements described in a distributed manner may be realized in a combined manner.

The scope of the present invention needs to be construed by the claims below, and the meaning and the scope of the claims and every modified or altered embodiment derived from an equivalent concept of the claims need to be construed to belong to the scope of the present invention.

REFERENCE SIGNS LIST

10: Sensor Module
11: First Sensor Module
12: Second Sensor Module
13: Third Sensor Module
20: Impedance Matching Unit
30: Amplifier
41: First Control Unit
42: Second Control Unit
50: Output Unit
60: Imaging Unit
70: Object
71: First Object
72: Second Object
73: Third Object
74: Fourth Object
75: Fifth Object
100: Sensor
101: 1-1st Sensor
102: 1-2nd Sensor
103: 3-1st Sensor
104: 3-2nd Sensor
110: Core
111$a$: 1-1st Core
111$b$: 1-2nd Core
112$a$: 2-1st Core
112$b$: 2-2nd Core
113$a$: 3-1st Core
113$b$: 3-2nd Core
120: Coil
121$a$: 1-1st Coil
121$b$: 1-2nd Coil
122$a$: 2-1st Coil
122$b$: 2-2nd Coil
123$a$: 3-1st Coil
123$b$: 3-2nd Coil
130: Housing

The invention claimed is:

1. A metal detecting system using a search-coil type sensor, comprising:
   at least one sensor module to detect at least one object moving around the at least one sensor module, wherein each of the at least one sensor module comprises at least one sensor;
   at least one imaging unit to image the at least one object moving around the at least one sensor module;
   at least one impedance matching unit connected to the at least one sensor module and the at least one impedance matching unit to perform impedance matching;
   at least one amplifier connected to the at least one impedance matching unit and the at least one amplifier to amplify a fine current and voltage generated during approach of the at least one object to the at least one sensor module;
   a first control unit connected to the at least one amplifier, wherein the first control unit is configured to:
      store data of respective signal patterns based on magnetic flux densities and speeds of a plurality of objects detected by the at least one sensor module and data of a compound pattern obtained when at least two of the respective signal patterns are superimposed, and
      individually identify the plurality of objects by separating the respective signal patterns from each other to generate separated signal patterns of the plurality of objects; and
   a second control unit connected to the first control unit and the at least one imaging unit, wherein the second control unit is configured to:
      receive the separated signal patterns of the plurality of objects from the first control unit,
      collect captured images acquired by the at least one imaging unit,
      determine whether a magnetic flux density of each one of the plurality of objects is within a predetermined magnetic flux density range to make a categorization of the each one of the plurality of objects, and confirm the categorization of the each one of the plurality of objects based on the captured images when the each one of the plurality of objects is exposed, wherein a heat detecting function of the at least one imaging unit is used to confirm the categorization of the each one of the plurality of objects by collecting a thermal image of the each one of the plurality of objects when the each one of the plurality of objects is not exposed.

2. The metal detecting system according to claim 1, wherein the second control unit generates an alarm signal when determining that the each one of the plurality of objects is a firearm.

3. The metal detecting system according to claim 2, further comprising an output unit connected to the second control unit to visually output locational changes of the plurality of objects and to output the alarm signal.

4. The metal detecting system according to claim 1, wherein the at least one sensor comprises a first sensor and a second sensor arranged in parallel with the first sensor, and a core and a coil of the first sensor is formed at a right portion of the first sensor and a core and a coil of the second sensor is formed a left portion of the second sensor.

5. A metal detecting system using a search-coil type sensor, comprising:

at least one sensor module to detect at least one object moving around the at least one sensor module, wherein each of the at least one sensor module comprises a plurality of sensors, and wherein the plurality of sensors are radially arranged so as to have measurable regions of the plurality of sensors to be contiguous to each other;

at least one imaging unit to image the at least one object moving around the at least one sensor module;

at least one impedance matching unit connected to the at least one sensor module and the at least one impedance matching unit to perform impedance matching; and at least one amplifier connected to the at least one impedance matching unit and the at least one amplifier to amplify a fine current and voltage generated during approach of the at least one object to the at least one sensor module;

a first control unit connected to the at least one amplifier, wherein the first control unit is configured to:

store data of respective signal patterns based on magnetic flux densities and speeds of a plurality of objects and data of a compound pattern obtained when at least two of the respective signal patterns are superimposed, and individually identify the plurality of objects by separating the respective signal patterns from each other to generate separated signal patterns of the plurality of objects; and a second control unit connected to the first control unit and the at least one imaging unit, wherein the second control unit is configured to:

receive the separated signal patterns of the plurality of objects from the first control unit, collect captured images acquired by the at least one imaging unit, determine whether a magnetic flux density of each one of the plurality of objects is within a predetermined magnetic flux density range to make a categorization of the each one of the plurality of objects, and confirm the categorization of the each one of the plurality of objects based on the captured images when the each one of the plurality of objects is exposed, wherein a heat detecting function of the at least one imaging unit is used to confirm the categorization of the each one of the plurality of objects by collecting a thermal image of the each one of the plurality of objects when the each one of the plurality of objects is not exposed.

6. The metal detecting system according to claim 5, wherein the second control unit generates an alarm signal when determining that the each one of the plurality of objects is a firearm.

7. The metal detecting system according to claim 6, further comprising an output unit connected to the second control unit to visually output locational changes of the plurality of objects and to output the alarm signal.

8. The metal detecting system according to claim 5, wherein the plurality of sensors is arranged in a three-dimensional radial shape to form measurable regions of the plurality of sensors in spherical shapes.

* * * * *